United States Patent
Yang et al.

(10) Patent No.: US 10,367,478 B2
(45) Date of Patent: *Jul. 30, 2019

(54) WINDOW FUNCTION PROCESSING MODULE

(71) Applicant: Shenzhen Goodix Technology Co., Ltd., Shenzhen, Guangdong (CN)

(72) Inventors: Fu-Chiang Yang, Taipei (TW); Ya-Nan Wen, Taipei (TW); Yingsi Liang, Guangdong (CN)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 24 days.

This patent is subject to a terminal disclaimer.

(21) Appl. No.: 15/696,195

(22) Filed: Sep. 6, 2017

(65) Prior Publication Data

US 2018/0013410 A1    Jan. 11, 2018

Related U.S. Application Data

(63) Continuation of application No. PCT/CN2017/079113, filed on Mar. 31, 2017.

(30) Foreign Application Priority Data

Apr. 1, 2016 (WO) ............... PCT/CN2016/078308

(51) Int. Cl.
| | |
|---|---|
| G06F 7/64 | (2006.01) |
| H03H 19/00 | (2006.01) |
| G06F 3/044 | (2006.01) |
| H03D 7/14 | (2006.01) |
| G06F 17/12 | (2006.01) |

(Continued)

(52) U.S. Cl.
CPC ........... *H03H 19/004* (2013.01); *G06F 3/044* (2013.01); *G06F 3/0416* (2013.01);
(Continued)

(58) Field of Classification Search
CPC ...... H03H 19/004; H03H 7/38; H03H 11/126; H03H 2210/036; H03H 2210/028;
(Continued)

(56) References Cited

U.S. PATENT DOCUMENTS 5,245,646 A  *  9/1993  Jackson ............. H03H 11/1291
                                                    327/553
7,176,699 B2 *  2/2007  Trochut ................... H03H 1/02
                                                    324/677
(Continued)

FOREIGN PATENT DOCUMENTS

| CN | 203014760 U | 6/2013 |
|---|---|---|
| CN | 104238846 A | 12/2014 |

(Continued)

*Primary Examiner* — Ryan Jager
(74) *Attorney, Agent, or Firm* — Winston Hsu

(57) ABSTRACT

The present application provides a window function processing module including an integrating circuit, configured to receive an integrating input signal, the integrating circuit comprising an operational amplifier; an integrating capacitor, coupled to an output terminal and a first input terminal of the operational amplifier; and an adjustable impedance module, coupled between the first input terminal of the operational amplifier and an integrating input terminal of the integrating circuit, wherein the adjustable impedance module is controlled by at least one control signal to adjust an impedance value of the adjustable impedance module; and a control unit, coupled to the integrating circuit, configured to generate the at least one control signal according to a window function, to adjust the integration gain of the integrating circuit, such that the integrating output signal is related to an operation result of the integrating input signal and the window function.

13 Claims, 9 Drawing Sheets

(51) Int. Cl.
  *H03H 7/38* (2006.01)
  *H03K 5/02* (2006.01)
  *H03K 5/1252* (2006.01)
  *G06F 3/041* (2006.01)
  *H03F 3/45* (2006.01)
  *H03H 11/12* (2006.01)

(52) U.S. Cl.
  CPC ............ *G06F 3/0418* (2013.01); *G06F 17/12* (2013.01); *H03D 7/14* (2013.01); *H03F 3/45475* (2013.01); *H03H 7/38* (2013.01); *H03H 11/126* (2013.01); *H03K 5/02* (2013.01); *H03K 5/1252* (2013.01); *H03D 2200/0086* (2013.01); *H03F 2200/264* (2013.01); *H03F 2203/45526* (2013.01); *H03F 2203/45594* (2013.01); *H03F 2203/45616* (2013.01); *H03H 2210/028* (2013.01); *H03H 2210/036* (2013.01)

(58) Field of Classification Search
  CPC ...... G06F 3/0418; G06F 17/12; G06F 3/0416; G06F 3/044; H03K 5/02; H03K 5/1252; H03F 3/45475; H03F 2200/264; H03F 2203/45526; H03F 2203/45594; H03F 2203/45616; H03D 2200/0086; H03D 7/14
  USPC .......................................................... 327/339
  See application file for complete search history.

(56) References Cited

U.S. PATENT DOCUMENTS

| | | | | |
|---|---|---|---|---|
| 8,803,559 B2* | 8/2014 | Toyotaka | ................ | H03F 3/005 327/94 |
| 9,141,239 B2* | 9/2015 | Yun, II | .................... | G06F 3/044 |
| 2006/0145681 A1* | 7/2006 | Trochut | ................... | H03H 1/02 324/76.28 |
| 2011/0043279 A1* | 2/2011 | Adachi | ................... | H03F 3/187 330/86 |
| 2011/0102061 A1 | 5/2011 | Wang | | |
| 2011/0170628 A1* | 7/2011 | Oishi | ...................... | H04L 27/04 375/295 |
| 2011/0221503 A1* | 9/2011 | Oka | ................... | H03H 11/1291 327/337 |
| 2012/0182028 A1 | 7/2012 | Oya | | |
| 2012/0218020 A1 | 8/2012 | Erdogan | | |
| 2012/0218223 A1* | 8/2012 | Erdogan | ........... | G01R 27/2605 345/174 |
| 2013/0176269 A1* | 7/2013 | Sobel | ..................... | G06F 3/044 345/174 |
| 2014/0009431 A1 | 1/2014 | Kwon | | |
| 2014/0028620 A1 | 1/2014 | Deng | | |
| 2014/0176482 A1 | 6/2014 | Wei | | |
| 2014/0267129 A1 | 9/2014 | Rebeschi | | |
| 2014/0327644 A1 | 11/2014 | Mohindra | | |
| 2015/0180493 A1 | 6/2015 | Liu | | |
| 2015/0372657 A1 | 12/2015 | Bianchi | | |
| 2018/0026608 A1 | 1/2018 | Yang | | |
| 2018/0062595 A1* | 3/2018 | Osawa | ..................... | H03F 1/26 |

FOREIGN PATENT DOCUMENTS

| | | |
|---|---|---|
| CN | 104731425 A | 6/2015 |
| EP | 0 678 980 A1 | 10/1995 |
| JP | 2012-145468 A | 8/2012 |
| KR | 10-2014-0007542 A | 1/2014 |
| KR | 10-2015-0130334 A | 11/2015 |
| WO | 2016/032704 A1 | 3/2016 |

* cited by examiner

WINDOW FUNCTION PROCESSING MODULE

CROSS REFERENCE TO RELATED APPLICATION

The present application is a continuation of international application No. PCT/CN 2017/079113 filed on Mar. 31, 2017, which claims the priority to international application No. PCT/CN 2016/078308, filed on Apr. 1, 2016, both of which are hereby incorporated by reference in their entireties.

TECHNICAL FIELD

The present application relates to an integrating circuit and a window function processing module, and more particularly, to a window function processing module capable of suppressing sidelobe.

BACKGROUND

Matched filters and mixers are widely exploited in communication systems and capacitive touch control systems. In general, a mixer may be realized by a multiplier, which generates a multiplication result of a received signal and a local signal. In addition, the mixer may be further realized by a switching mixer with high linearity and low noise. The switching mixer is equivalent to multiplying the received signal by a square wave (i.e., the local signal). However, either the square wave or the sinusoidal wave has sidelobe in frequency domain, and an extra noise is brought in, such that a system SNR (Signal to Noise Ratio) is lowered. In order to solve problem of noise brought by the sidelobe, window function may be applied before the integrator. As FIG. 1 shows, a signal SIG1 represents a waveform without applying any window function, and a signal SIG2 represents a waveform applying a window function e. As can be seen from FIG. 1, the window function e may be regarded as an envelop of the signal SIG2. Applying the window function e may effectively suppress noise brought by sidelobe, and enhance an anti-interference capability around the frequency band, such that the system SNR is enhanced.

The effect of window function may be realized by digital integrator, where the digital integrator may use different integrating gains at different time intervals, to achieve the effect of applying window function. However, an output frequency of the digital integrator is high, which is not suitable for the design of the front-end analog-to-digital converter (ADC). In other words, the front-end analog-to-digital converter needs to have sufficient high sampling rate to accurately perform sampling on the high frequency output signal, where the power consumption and complexity of the circuit are raised. Therefore, it is necessary to improve the related art.

SUMMARY

It is therefore a primary objective of the present application to provide a window function processing module capable of suppressing sidelobe, to improve over disadvantages of the related art.

The present application discloses a window function processing module including an integrating circuit configured to receive an integrating input signal to generate an integrating output signal, where the integrating circuit includes an operational amplifier; an integrating capacitor coupled to an output terminal and a first input terminal of the operational amplifier; and an adjustable impedance module coupled between the first input terminal of the operational amplifier and an integrating input terminal of the integrating circuit, wherein the adjustable impedance module is controlled by at least one control signal to adjust an impedance value of the adjustable impedance module, and the impedance value is related to an integration gain of the integrating circuit; and a control unit coupled to the integrating circuit, configured to generate the at least one control signal according to a window function, to adjust the integration gain of the integrating circuit, such that the integrating output signal is related to an operation result of the integrating input signal and the window function.

For example, the adjustable impedance module includes an adjustable resistance module, and the adjustable resistance module receive a plurality of first control signals to adjust a resistance of the adjustable resistance module.

For example, the adjustable resistance module include a plurality of resistor-selecting units, controlled by the plurality of first control signals, respectively, and each resistor-selecting unit includes a resistor; and a resistance-controlling switch, coupled to the resistor.

For example, the plurality of resistor-selecting units are connected to each other in parallel, and the resistor and the resistance-controlling switch of each resistor-selecting unit are connected to each other in series; or the plurality of resistor-selecting units are connected to each other in series, and the resistor and the resistance-controlling switch of each resistor-selecting unit are connected to each other in parallel.

For example, the adjustable impedance module include a switched-capacitor module, coupled between the first input terminal of the operational amplifier and the integrating input terminal of the integrating circuit, and the switched-capacitor module includes an adjustable capacitance module, receiving a plurality of second control signals, to adjust a capacitance value between a first terminal and a second terminal of the adjustable capacitance module; a first switch, coupled to the first terminal; a second switch, coupled between the first terminal and a ground; a third switch, coupled between the second terminal and the first input terminal of the operational amplifier; and a fourth switch, coupled between the second terminal and the ground.

For example, the adjustable capacitance module include a plurality of capacitor-selecting units, controlled by the plurality of second control signals, respectively, and each capacitor-selecting unit includes a capacitor; and a capacitance-controlling switch, coupled to the capacitor.

For example, the plurality of capacitor-selecting units are connected to each other in parallel, the capacitor and the capacitance-controlling switch of each capacitor-selecting unit are connected to each other in series signal; or wherein the plurality of capacitor-selecting units are connected to each other in series, the capacitor and the capacitance-controlling switch of each capacitor-selecting unit are connected to each other in parallel.

For example, the switched-capacitor module further includes at least a resistor unit, coupled between the first switch and the third switch.

For example, the window function processing module further includes a mixing unit, coupled to the integrating circuit, configured to generate the integrating input signal.

For example, the window function processing module further includes an analog-to-digital converter, coupled to the integrating circuit, configured to convert the integrating output signal as a digital signal.

For example, the window function is one of a triangular window, a Hann window, a Hamming window, a Blackman window, a cosine window or a Gaussian window.

By the window function processing module provided by the present application, the adjustable resistance module may be controlled by the control signals, to adjust a resistance value between the first terminal and the second terminal of the adjustable resistance module at different time intervals, so as to change the integration gain of the integrating circuit at the different time intervals; or the adjustable capacitance module may be controlled by the control signals, to adjust a capacitance value between the first terminal and the second terminal of the adjustable capacitance module at different time intervals, so as to change the integration gain of the integrating circuit at the different time intervals. The present application utilizes analog integrator to realize the effect of window function, which may adjust the integration gain corresponding to different time intervals, reduce noise brought by sidelobe and enhance the SNR. Compared to the related art, the integrating circuit of the present application may reduce a requirement of sampling rate of the analog-to-digital converter, such that the power consumption and complexity of the overall circuit are reduced.

BRIEF DESCRIPTION OF THE DRAWINGS

One or more of the exemplary embodiments illustrated by the drawings of the corresponding images, which illustrate exemplary embodiments does not constitute a limited, elements the same reference numerals in the drawings with numeral represented as similar elements, unless otherwise stated, the accompanying drawings do not constitute a limit on.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

Figure 9:
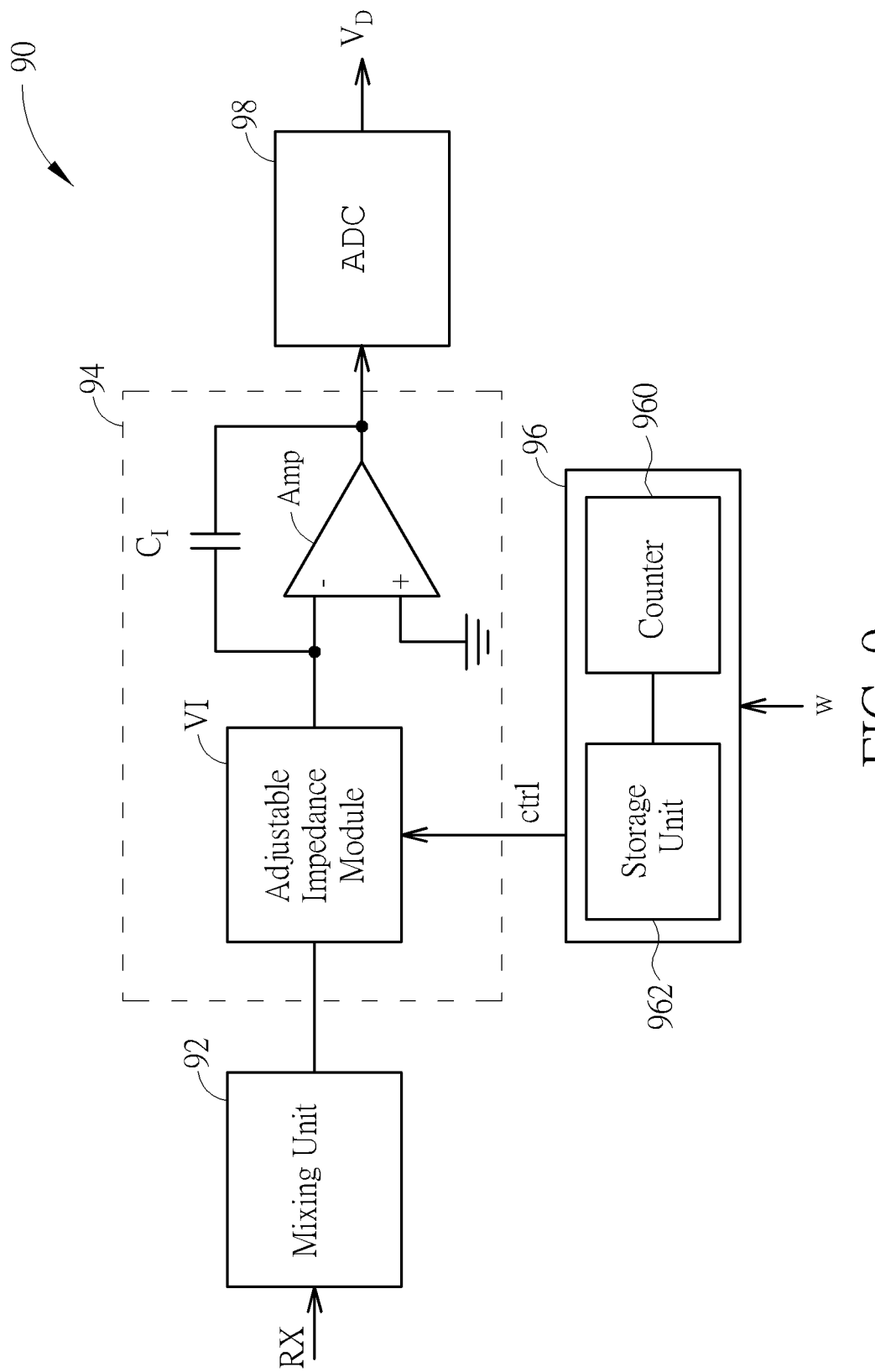
FIG. 9 is a schematic diagram of a window function processing module according to an embodiment of the present application.

The present application utilizes an analog integrating circuit to realize an effect of window function, which is able to adjust different integration gains, corresponding to different time intervals, at different time intervals, such that the integrating output signal of the integrating circuit is related to an operation result of the integrating input signal and the window function, so as to reduce an effect of low SNR (Signal-to-Noise Ratio) of overall system brought by sidelobes or spectrum leakage. Please refer to FIG. 9. FIG. 9 is a schematic diagram of a window function processing module 90 according to an embodiment of the present application. The window function processing module 90 receives a signal RX. The window function processing module 90 is configured to perform a mixing operation and an integration operation on the signal RX, and convert a result of the mixing operation and the integration operation into digital signal, so as to provide the backend digital signal processing module to perform further digital signal processing. The window function processing module 90 includes a mixing unit 92, an integrating circuit 94, a control unit 96 and an analog-to-digital converter 98. The mixing unit 92 is configured to receive the signal RX, perform the mixing operation on the signal RX, and output a result of the mixing operation as an integrating input signal $V_{IN}$. The integrating circuit 94 is configured to perform the integration operation on the integrating input signal $V_{IN}$ to generate an integrating output signal $V_{OUT}$. The analog-to-digital converter 98 is configured to convert the integrating output signal $V_{OUT}$ as a digital signal $V_D$, for the backend digital signal processing module to perform further digital signal processing. For example, the window function processing module 90 may be applied in a touch control device, and the backend digital signal processing module of the window function processing module 90 may determine whether an electrode related to the signal RX corresponds to a capacitance variation according to the digital signal $V_D$, and further determine whether a tough event occurs at the electrode related to the signal RX. In addition, the mixing unit 92 may be a switching mixer, and the technical details thereof may be referred to the switching mixer disclosed in China Patent Application No. CN201510967581.0 by the applicant of the present application, which is no longer narrated herein for brevity.

Furthermore, to reduce extra noise brought by sidelobes or spectrum leakage in the integrating input signal $V_{IN}$, the window function processing module 90 may utilize the control unit 96 to adjust the integration gain of the integrating circuit 94. Specifically, the integrating circuit 94 includes an operational amplifier Amp, an integrating capacitor $C_I$ and an adjustable impedance module VI. The adjustable impedance module VI has an impedance value, and the integration gain of the integrating circuit 94 is related to the impedance value of the adjustable impedance module VI. Furthermore, the adjustable impedance module VI is controlled by one or more control signal ctrl generated by the control unit 96, and has different impedance values at different time. Thus, the integrating circuit 94 would have different integration gains at the different time, such that the integrating output signal $V_{OUT}$ would be related to an operation result of the integrating input signal $V_{IN}$ and a window function w. In other words, the control unit 96 may generate the control signal ctrl to control the impedance value of the adjustable impedance module VI according to the window function w, so as to adjust the integration gain of the integrating circuit 94. Therefore, the integrating output signal $V_{OUT}$ may be related to the operation result of the integrating input signal $V_{IN}$ and the window function w. In an embodiment, the integrating output signal $V_{OUT}$ may approach $V_{OUT}(t) = \int V_{IN}(t)w(t)dt$, i.e., the integrating output signal $V_{OUT}$ approaches an integration result of the integrating input signal $V_{IN}$ times the window function w, wherein $V_{OUT}(t)$, $V_{IN}(t)$ and $w(t)$ represent time-varying functions of $V_{OUT}$, $V_{IN}$ and w, respectively. In addition, the window function w may be one of a triangular window, a Hann window, a Hamming window, a Blackman window, a cosine window and a Gaussian window, and not limited thereto.

Figure 3:
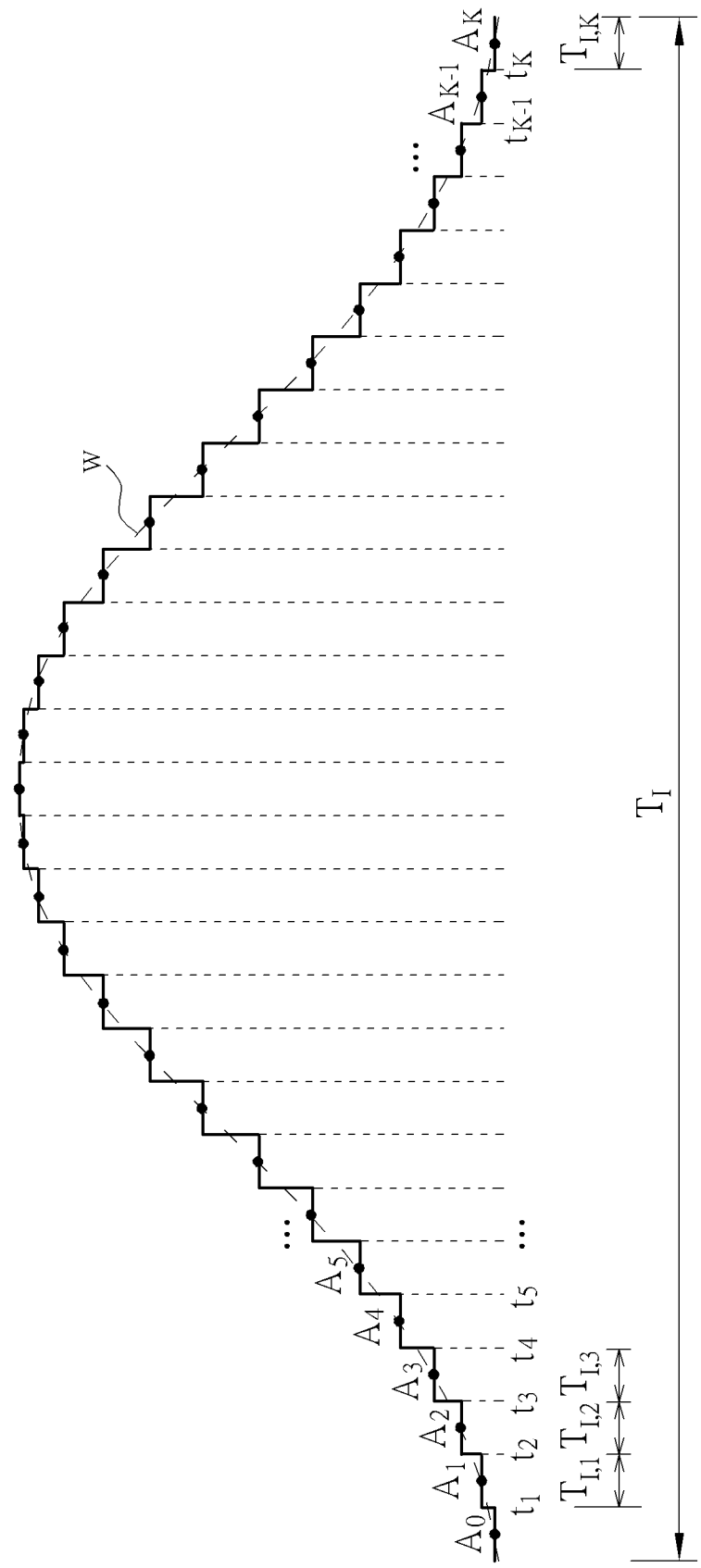
FIG. 3 is a schematic diagram of the integration gain of the integrating circuit in FIG. 2 varying with respect to time.

Specifically, please refer to FIG. 3. FIG. 3 is a schematic diagram of the integration gain of the integrating circuit 94 varying with respect to time. The control unit 96 may divide an integrating interval $T_I$ into K+1 integrating subintervals $T_{I,0}$-$T_{I,K}$, wherein the integrating interval $T_I$ is a time interval between a time $t_0$ and a time $t_{N+1}$, and the integrating subinterval $T_{I,k}$ represents a time interval between a time $t_k$ and a time $t_{k+1}$. The control unit 96 may generate the control signal ctrl to adjust the impedance value of the adjustable impedance module VI at the integrating subinterval $T_{I,k}$, such that the integrating circuit 94 has an integration gain $A_k$ at the integrating subinterval $T_{I,k}$. In the current embodiment, the control unit 96 may include a counter 960. The counter 960 add 1 to a counting value of the counter 960 every clock cycle, wherein the counting value of the counter 960 may represent/record a time of the integrating circuit 94 preforming integration. When the integration time of the integrating circuit 94 corresponding to the counting value of the counter 960 is between the time $t_k$ and the time $t_{k+1}$ (within the integrating subinterval $T_{I,k}$), the control unit 96 generates the control signal ctrl to control the adjustable impedance module VI such that the integrating circuit 94 would have the integration gain $A_k$. In other words, the integrating circuit 94 would have the integration gain $A_0$-$A_K$, corresponding to the integrating subintervals $T_{I,0}$-$T_{I,K}$, at the different integrating subintervals $T_{I,0}$-$T_{I,K}$. When the integrating subintervals $T_{I,0}$-$T_{I,K}$ are more dense (i.e., K is larger), the integrating output signal $V_{OUT}$ is more closed to $V_{OUT}(t) = \int V_{IN}(t)w(t)dt$.

In addition, in the current embodiment, the control unit 96 may include a storage unit 962. Preferably, the storage unit 962 is a non-volatile memory (NVM) such as EEPROM (Electrically Erasable Programmable Read Only Memory) or a flash memory. The storage unit 962 is configured to store the plurality of control signals ctrl to make the integrating circuit 94 have the integration gain $A_0$-$A_K$ at the integrating subintervals $T_{I,0}$-$T_{I,K}$, wherein the plurality of control signals ctrl corresponding to the integrating subintervals $T_{I,0}$-$T_{I,K}$ are related to the window function w.

Therefore, the control unit 96 may output the control signals ctrl, corresponding to the integrating subintervals $T_{I,0}$-$T_{I,K}$, at the different integrating subintervals $T_{I,0}$-$T_{I,K}$, such that the integrating circuit 94 may have the different integration gain $A_0$-$A_K$, corresponding to the integrating subintervals $T_{I,0}$-$T_{I,K}$, at the integrating subintervals $T_{I,0}$-$T_{I,K}$. When the counting value of the counter 960 is within the integrating subinterval $T_{I,k}$, the control unit 96 reads the storage unit 962, to output the control signals ctrl corresponding to the integrating subinterval $T_{I,k}$, such that the integrating circuit 94 would have the integration gain $A_k$, corresponding to the integrating subinterval $T_{I,k}$, at the integrating subinterval $T_{I,k}$.

Figure 1:
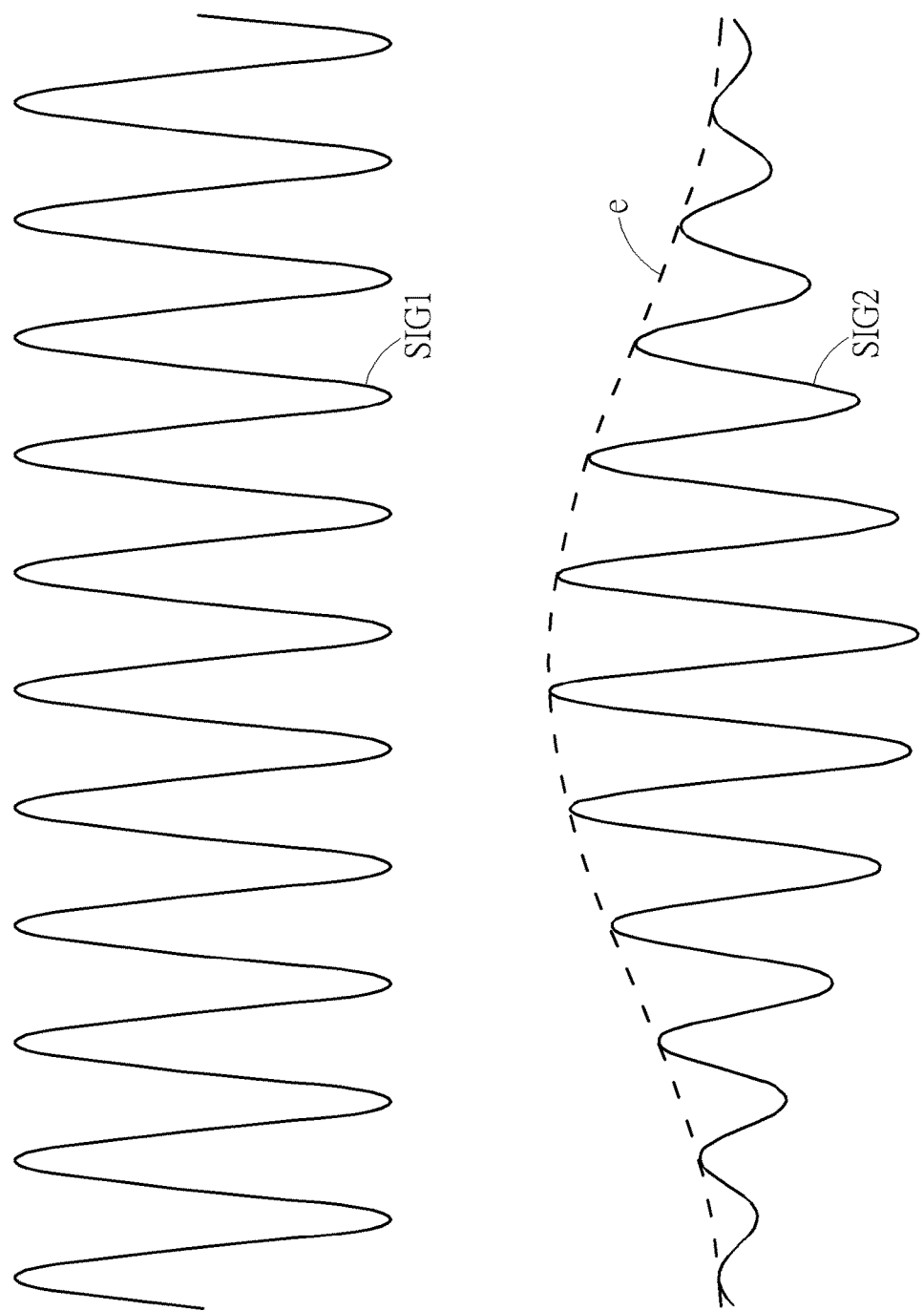
FIG. 1 is a schematic diagram of a plurality of waveforms.
Figure 2:
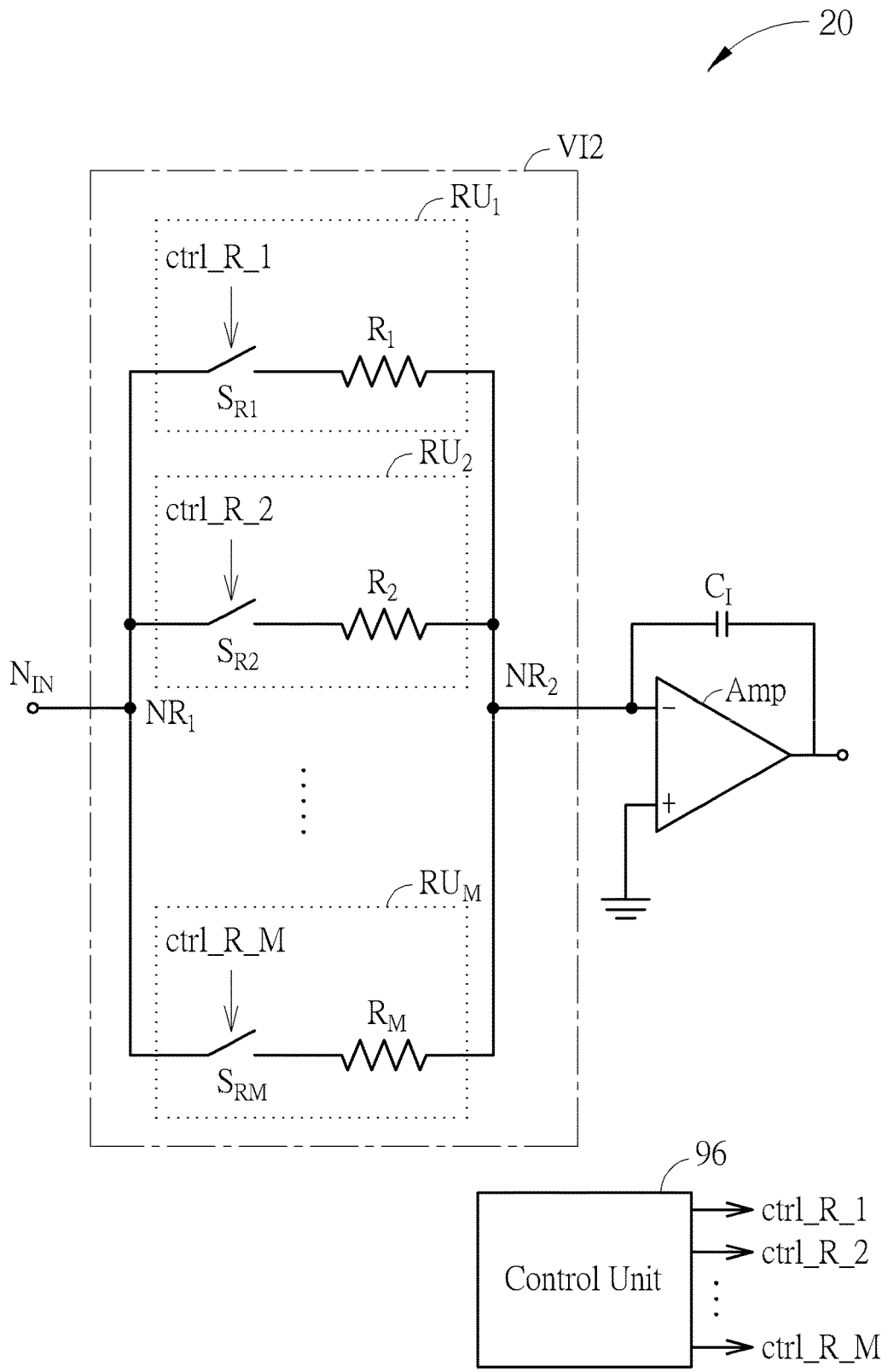
FIG. 2 is a schematic diagram of an integrating circuit according to an embodiment of the present application.

The integrating circuit 94 and the adjustable impedance module VI are not limited to any specific circuit structure. For example, please refer to FIG. 2. FIG. 2 is a schematic diagram of an integrating circuit 20 according to an embodiment of the present application. The integrating circuit 20 may be configured to realize the integrating circuit 94, which is a resistor-capacitor (RC) integrator and includes an operational amplifier Amp, an integrating capacitor $C_I$ and an adjustable impedance module VI2. The adjustable impedance module VI2 is an adjustable resistance module, which may be configured to realize the adjustable impedance module VI. The operational amplifier Amp includes a negative input terminal (denoted as "−"), a positive input terminal (denoted as "+") and an output terminal. The integrating capacitor $C_I$ is coupled between the negative input terminal and the output terminal of the operational amplifier Amp. The adjustable impedance module VI2 is coupled between the negative input terminal of the operational amplifier Amp and an integrating input terminal $N_{IN}$ of the integrating circuit 20. The adjustable impedance module VI2 is an adjustable resistance module, which includes resistor-selecting units $RU_1$-$RU_M$. The adjustable impedance module VI2 is formed by the resistor-selecting units $RU_1$-$RU_M$ connected to each other in parallel, wherein any resistor-selecting unit $RU_m$ within the resistor-selecting units $RU_1$-$RU_M$ includes a resistor $R_m$ and a resistance-controlling switch $S_{Rm}$. The resistance-controlling switch $S_{Rm}$ is controlled by a control signal ctrl_R_m. The resistor-selecting unit $RU_m$ is formed by the resistor $R_m$ connected to the resistance-controlling switch $S_{Rm}$ in series. In other words, the control signals ctrl_R_1-ctrl_R_M may control the adjustable impedance module VI2, to adjust a resistance value between a first terminal $NR_1$ and a second terminal $NR_2$ of the adjustable impedance module VI2 at the different time intervals, so as to change the integration gain of the integrating circuit 20 at the different integrating subintervals. Moreover, the control signals ctrl_R_1-ctrl_R_M may be generated by the control unit 96, and the storage unit 962 stores the required control signals ctrl_R_1-ctrl_R_M which allow the integrating circuit 94 to achieve the integration gain $A_0$-$A_K$ at the integrating subintervals $T_{I,0}$-$T_{I,K}$, wherein the control signals ctrl_R_1-ctrl_R_M corresponding to the integrating subintervals $T_{I,0}$-$T_{I,K}$ are related to a waveform of the window function w.

Figure 4:
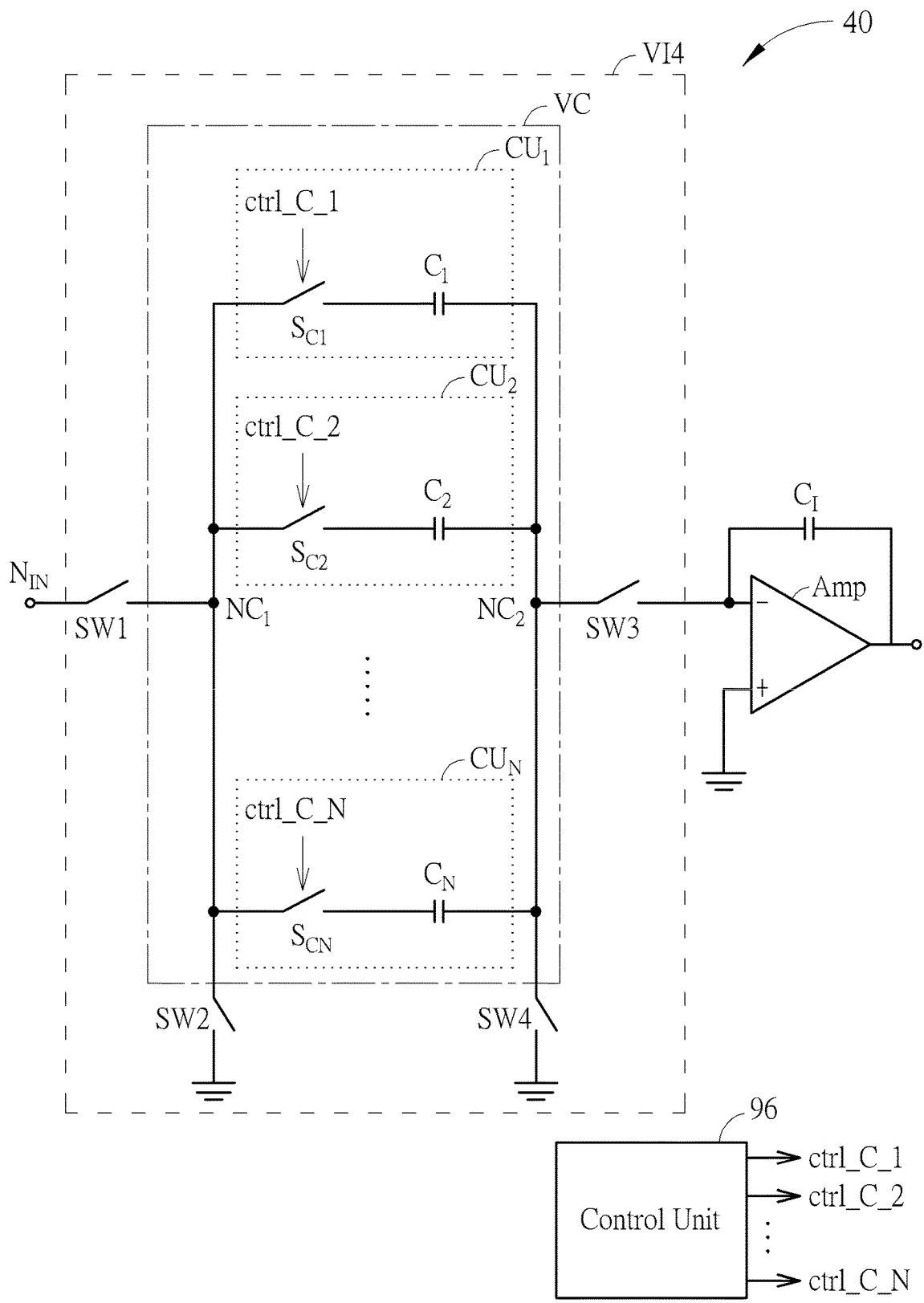
FIG. 4 is a schematic diagram of an integrating circuit according to an embodiment of the present application.

In addition, please refer to FIG. 4. FIG. 4 is a schematic diagram of an integrating circuit 40 according to an embodiment of the present application. The integrating circuit 40 is similar to the integrating circuit 20, and thus, same components are denoted by the same symbols. The integrating circuit 40, a switched-capacitor integrator, may also be configured to realize the integrating circuit 94. The integrating circuit 40 includes an adjustable impedance module VI4. The adjustable impedance module VI4, a switched-capacitor module, may be configured to realize the adjustable impedance module VI coupled between the negative input terminal of the operational amplifier Amp and the integrating input terminal $N_{IN}$ of the integrating circuit 40. The adjustable impedance module VI4 includes an adjustable capacitance module VC and switches SW1-SW4. The switches SW1, SW2 are coupled to a first terminal $NC_1$ of the adjustable resistance module VC. The switches SW3, SW4 are coupled to a second terminal $NC_2$ of the adjustable resistance module VC. The switches SW2, SW4 are coupled to a ground. The adjustable capacitance module VC includes capacitor-selecting units $CU_1$-$CU_N$. The adjustable capacitance module VC is formed by the capacitor-selecting units $CU_1$-$CU_N$ connected to each other in parallel, wherein any capacitor-selecting unit $CU_n$ within the capacitor-selecting units $CU_1$-$CU_N$ includes a capacitor $C_n$ and a capacitance-controlling switch $S_{Cn}$. The capacitance-controlling switch $S_{Cn}$ is controlled by a control signal ctrl_C_n. The capacitor-selecting unit $CU_n$ is formed by the capacitor $C_n$ connected to the capacitance-controlling switch $S_{Cn}$ in series. In other words, the control signals ctrl_C_1-ctrl_C_N may be configured to control the adjustable capacitance module VC, to adjust a capacitance value between the first terminal NC1 and the second terminal NC2 of the adjustable capacitance module VC at the different time intervals, so as to change integration gain of the integrating circuit 40 at the different time intervals. Moreover, the control signals ctrl_C_1-ctrl_C_N may be generated by the control unit 96, and the storage unit 962 stores the control signals ctrl_C_1-ctrl_C_N which allow the integrating circuit 94 to achieve the integration gain $A_0$-$A_K$ at the integrating subintervals $T_{I,0}$-$T_{I,K}$, wherein the control signals ctrl_C_1-ctrl_C_N corresponding to the integrating subintervals $T_{I,0}$-$T_{I,K}$ are related to the waveform of the window function w.

In addition, the switches SW1, SW2, SW3, SW4 may be controlled by frequency control signals ph1, ph2, where the frequency control signals ph1, ph2 are mutually orthogonal frequency control signals (i.e., time intervals of the frequency control signals ph1, ph2 being high voltage are not overlapped). Specifically, in an embodiment, the frequency control signal ph1 may be configured to control conduction status of the switches SW1, SW3, and the frequency control signal ph2 may be configured to control conduction status of the switches SW2, SW4. In another embodiment, the frequency control signal ph1 may be configured to control conduction status of the switches SW1, SW4, and the frequency control signal ph2 may be configured to control conduction status of the switches SW2, SW3. As long as the mutually orthogonal frequency control signals ph1, ph2 are utilized to control the conduction status of the switches SW1, SW2, SW3, SW4, requirements of the present application is satisfied, which is within the scope of the present application.

As can be seen, the window function processing module 90 may utilize the control unit 96 to adjust the resistance value of the adjustable impedance module VI2 and the capacitance value of the adjustable capacitance module VC at the different time intervals. In other words, the integrating circuit 20 and the integrating circuit 40 may change the integration gain of the integrating circuit 20 and the integrating circuit 40 at the different time intervals, so as to realize an effect of window function. Therefore, the window function processing module 90 may reduce noise brought by sidelobe, so as to enhance an overall SNR (Signal to Noise Ratio).

Figure 5:
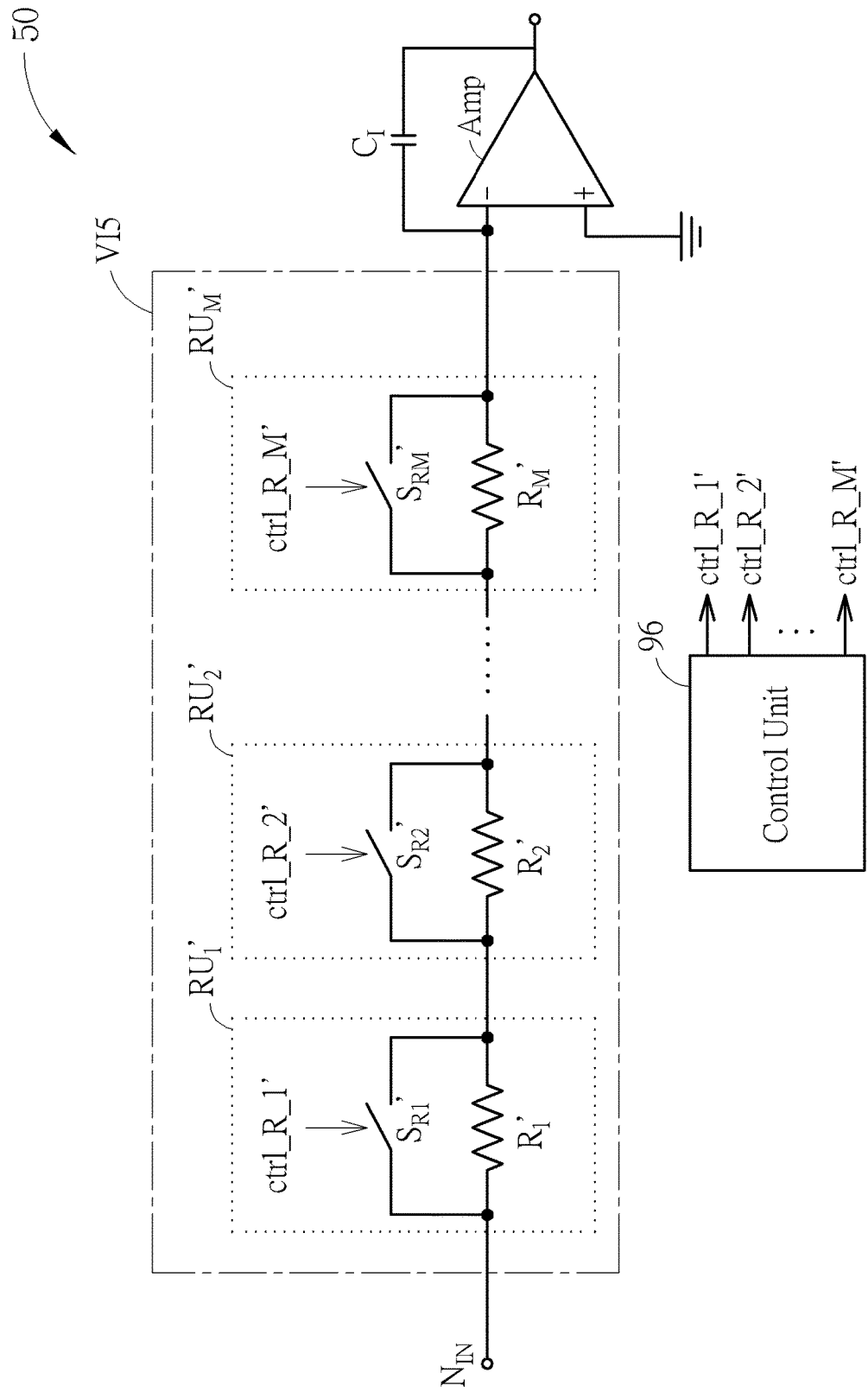
FIG. 5 is a schematic diagram of an integrating circuit according to an embodiment of the present application.
Figure 6:
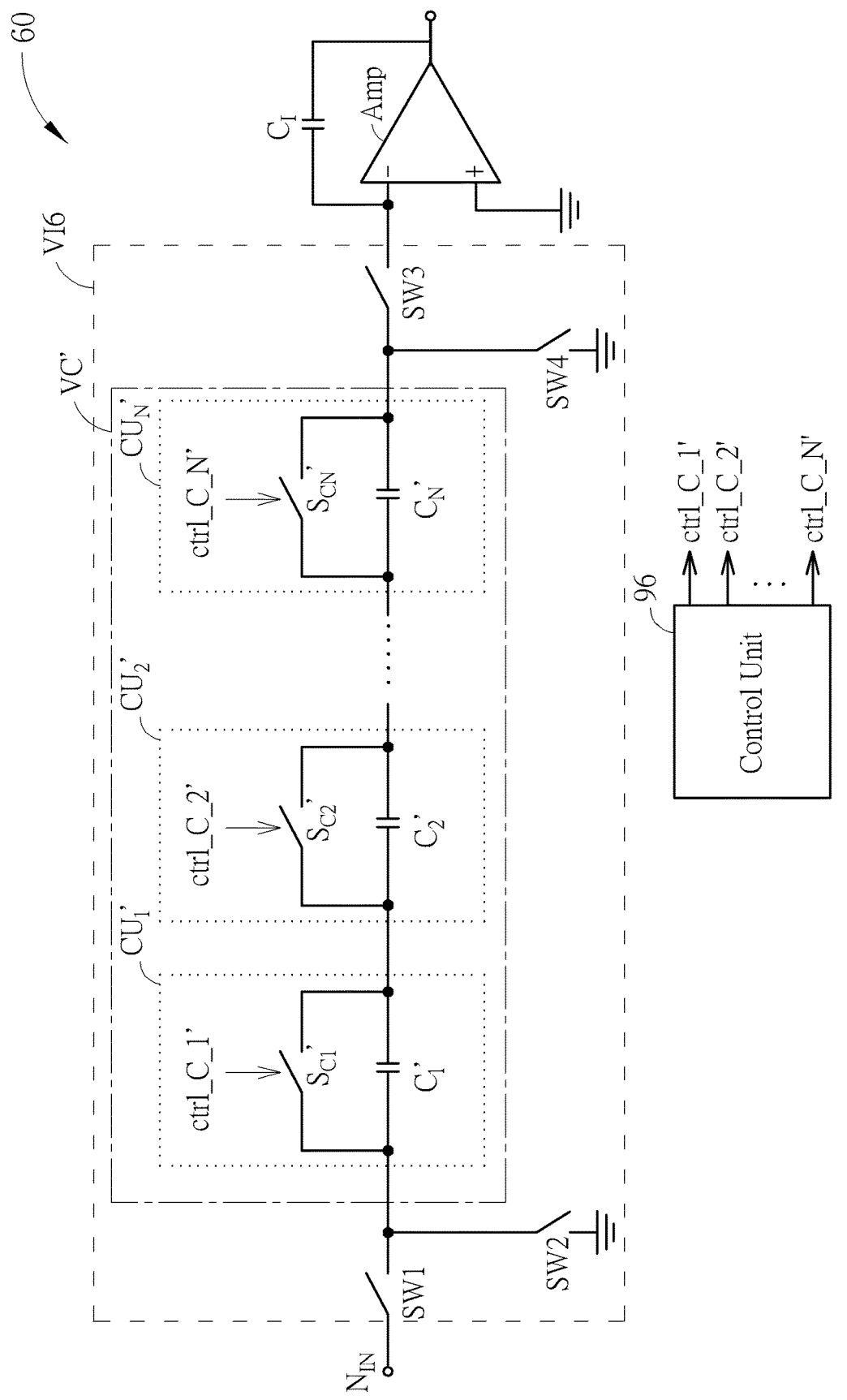
FIG. 6 is a schematic diagram of an integrating circuit according to an embodiment of the present application.

Notably, the embodiments stated in the above are utilized for illustrating the concept of the present application. Those skilled in the art may make modifications and alternations accordingly, and not limited herein. For example, in the adjustable impedance module VI2, the resistor-selecting units $RU_1$-$RU_M$ are connected to each other in parallel, and the resistor $R_m$ is connected to the resistance-controlling switch $S_{Rm}$ in series. In the adjustable capacitance module VC, the capacitor-selecting units $CU_1$-$CU_N$ are connected to each other in parallel, and the capacitor $C_n$ is connected to the capacitance-controlling switch $S_{Cn}$ in series, which is not limited thereto. Please refer to FIG. 5. FIG. 5 is a schematic diagram of an integrating circuit 50 according to an embodiment of the present application. The integrating circuit 50 is similar to the integrating circuit 20, and thus, same components are denoted by the same symbols. Different from the integrating circuit 20, the integrating circuit includes an adjustable impedance module VI5. The adjustable impedance module VI5, an adjustable resistance module, includes the resistor-selecting units $RU_1$-$RU_{M'}$. The adjustable impedance module VI5 is formed by the resistor-selecting units $RU_1$-$RU_{M'}$ connected to each other in series, wherein any resistor-selecting unit $RU_{m'}$ within the resistor-selecting units $RU_1$-$RU_{M'}$ includes a resistor $R_{m'}$ and a resistance-controlling switch $S_{Rm'}$. The resistance-controlling switch $S_{Rm'}$ is controlled by a control signal ctrl_R_m'. The resistor-selecting unit $RU_{m'}$ is formed by the resistor $R_{m'}$ connected to the resistance-controlling switch $S_{Rm'}$ in parallel. The control signals ctrl_R_1'-ctrl_R_M' may be generated by the control unit 96, and the storage unit 962 stores the required control signals ctrl_R_1'-ctrl_R_M' which allow the integrating circuit 94 to achieve the integration gain $A_0$-$A_K$ at the integrating subintervals $T_{I,0}$-$T_{I,K}$, wherein the control signals ctrl_R_1'-ctrl_R_M' corresponding to the integrating subintervals $T_{I,0}$-$T_{I,K}$ are related to the waveform of the window function w. Similarly, please refer to FIG. 6, FIG. 6 is a schematic diagram of an integrating circuit 60 according to an embodiment of the present application. The integrating circuit 60 is similar to the integrating circuit 40, and thus, same components are denoted by the same symbols. Different from the integrating circuit 40, the integrating circuit 60 include an adjustable impedance module VI6. The adjustable impedance module VI6, a switched-capacitor module, includes an adjustable capacitance module VC'. The adjustable capacitance module VC' includes the capacitor-selecting units $CU_1$-$CU_{N'}$. The adjustable capacitance module VC' is formed by the capacitor-selecting units $CU_1$-$CU_{N'}$ connected to each other in series, wherein any capacitor-selecting unit $CU_{n'}$ within the capacitor-selecting units $CU_1$-$CU_{N'}$ includes a capacitor $C_{n'}$ and a capacitance-controlling switch $S_{Cn'}$. The capacitance-controlling switch $S_{Cn'}$ is controlled by a control signal ctrl_C_n'. The capacitor-selecting unit $CU_{n'}$ is formed by the capacitor $C_{n'}$ connected to the capacitance-controlling switch $S_{Cn'}$ in parallel. Moreover, the control signals ctrl_C_1'-ctrl_C_N' may be generated by the control unit 96, and the storage unit 962 stores the control signals ctrl_C_1'-ctrl_C_N' which allow the integrating circuit 94 to achieve the integration gain $A_0$-$A_K$ at the integrating subintervals $T_{I,0}$-$T_{I,K}$, wherein the control signals ctrl_C_1'-ctrl_C_N' corresponding to the integrating subintervals $T_{I,0}$-$T_{I,K}$ are related to the waveform of the window function w.

Figure 7:
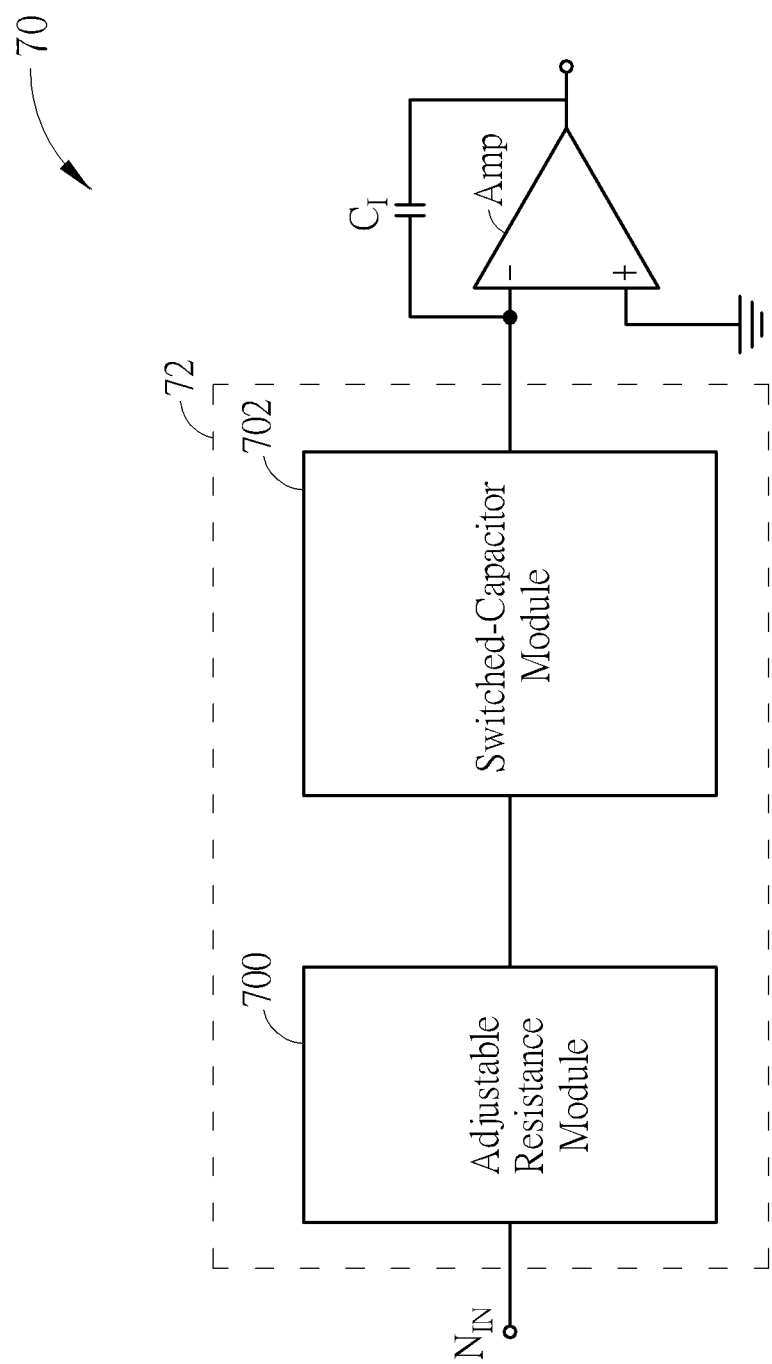
FIG. 7 is a schematic diagram of an integrating circuit according to an embodiment of the present application.

In addition, the integrating circuit may include the adjustable resistance module and the adjustable capacitance module at the same time. For example, please refer to FIG. 7. FIG. 7 is a schematic diagram of an integrating circuit 70 according to an embodiment of the present application. The integrating circuit 70 is similar to the integrating circuit 20, and thus, same components are denoted by the same symbols. The integrating circuit 70 includes an adjustable impedance module 72, and the adjustable impedance module 72 may include an adjustable resistance module 700 and a switched-capacitor module 702. The adjustable resistance module 700 and the switched-capacitor module 702 are both coupled between the negative input terminal of the operational amplifier Amp and the integrating input terminal NIN of the integrating circuit 70, wherein the adjustable resistance module 700 may be realized by the adjustable impedance/resistance module VI2 or the adjustable impedance/resistance module VI5, and the switched-capacitor module 702 may be realized by the adjustable impedance module switched-capacitor module VI4 or the adjustable impedance module/switched-capacitor module VI6, which is not limited thereto.

Figure 8:
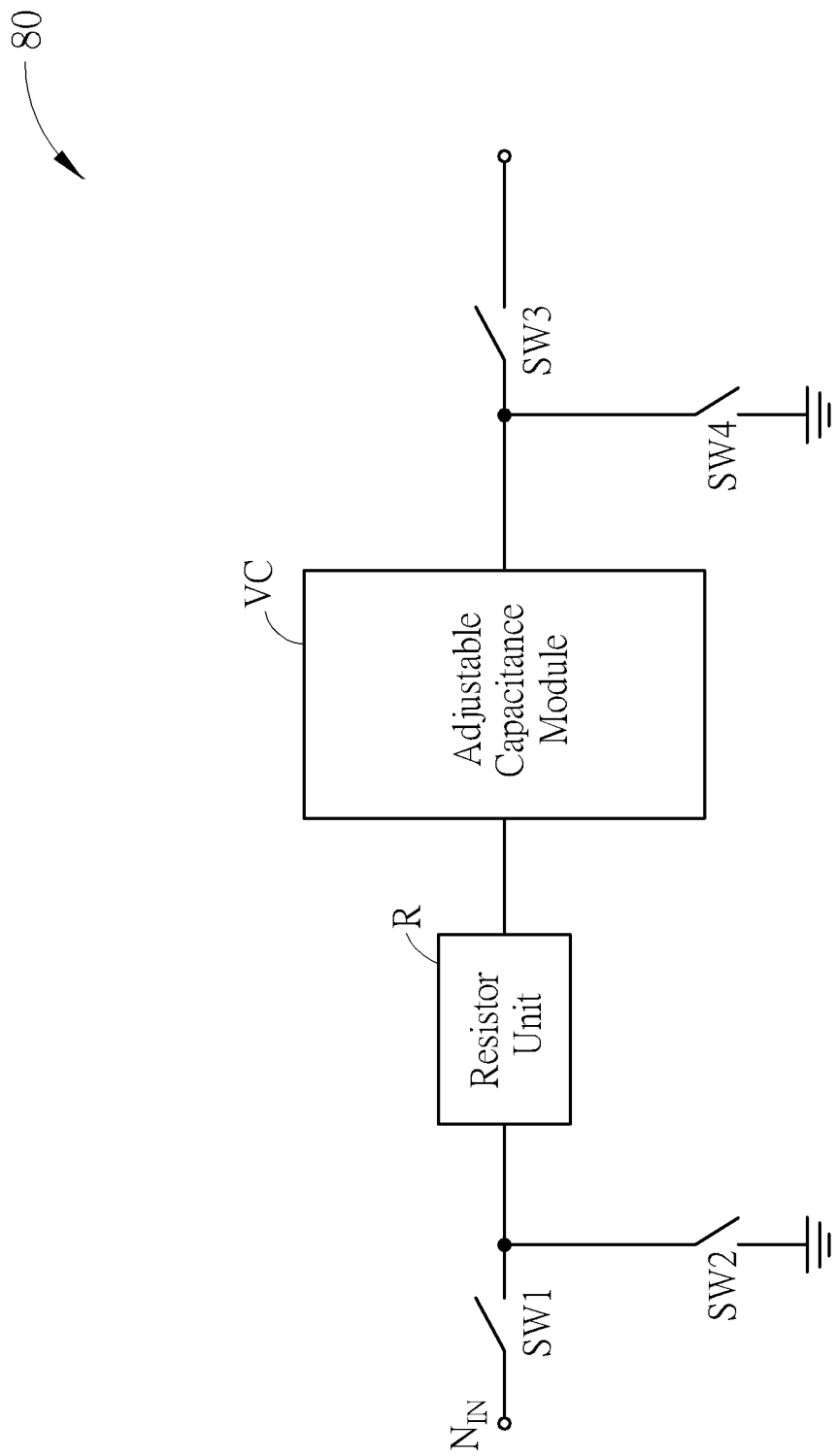
FIG. 8 is a schematic diagram of an adjustable impedance module according to an embodiment of the present application.

In addition, the adjustable impedance module/switched-capacitor module is not limited to be realized by the adjustable impedance module VI4 or the adjustable impedance module VI6 stated in the above. The switched-capacitor module may further include a resistor coupled between the switches SW1, SW3. For example, please refer to FIG. 8. FIG. 8 is a schematic diagram of an adjustable impedance module/switched-capacitor module 80 according to an embodiment of the present application. Different from the adjustable impedance modules VI4, VI6, the adjustable impedance module/switched-capacitor module 80 further includes a resistor unit R coupled between the switches SW1, SW3, where the resistor unit R may be one single resistor component or an adjustable resistance module, which is also within the scope of the present application.

Other details of the integrating circuit, the adjustable resistance module, the adjustable capacitance module, the switched-capacitor module and the derivative alterations thereof are referred to the integrating circuit, the adjustable resistance module, the adjustable capacitance module and the switched-capacitor module disclosed in PCT/CN2016/078308 by the applicant of the present application, which is no longer narrated herein for brevity.

The window function processing module in the related art usually utilize the analog-to-digital converter to convert the mixing output of the mixing unit as digital signal, and perform window function related operation in digital domain. In such a condition, the analog-to-digital converter within the window function processing module in the art requires higher sampling rate, which (over-)raise data amount of the window function processing module and computation complexity. In comparison, the present application utilizes the control unit to adjust the integration gain of the integrating circuit at the different integrating subintervals, such that the integrating output signal is related to the operation result of the integrating input signal and the window function. After that, the analog-to-digital conversion is then performed on the integrating output signal. In other words, the present application performs window function related operation in the analog domain, which does not requirement large data amount and computation complexity and also reduce the rate of the analog-to-digital converter. Therefore, the present application is able to use the window function to lower the extra noise within the integrating input signal brought by sidelobes or spectrum leakage, without demanding large data amount and computation complexity, so as to enhance the over system SNR.

In summary, the present application utilizes the adjustable resistance module or the adjustable capacitance module to change the integration gain of the integrating circuit at the different integrating subintervals, so as to realize the window function, reduce noise brought by sidelobe and enhance the SNR. Compared to the related art, the present application may reduce the requirement of the sampling rate of the analog-to-digital converter, such that the power consumption and complexity of the overall circuit are reduced.

The foregoing is only preferred embodiments of the present application, it is not intended to limit the present application, any modifications within the spirit and principles of the present application made, equivalent replacement and improvement, etc., should be included in this within the scope of the disclosure.

What is claimed is:

1. A window function processing module, comprising:
   an integrating circuit, configured to receive an integrating input signal to generate an integrating output signal, the integrating circuit comprises:
   an operational amplifier;
   an integrating capacitor, coupled to an output terminal and a first input terminal of the operational amplifier; and
   an adjustable impedance module, coupled between the first input terminal of the operational amplifier and an integrating input terminal of the integrating circuit, wherein the adjustable impedance module is controlled by at least one control signal to adjust an impedance value of the adjustable impedance module, and the impedance value is related to an integration gain of the integrating circuit; and
   a control unit, coupled to the integrating circuit, configured to generate the at least one control signal according to a window function, to adjust the integration gain of the integrating circuit, such that the integrating output signal is related to an operation result of the integrating input signal and the window function.

2. The window function processing module of claim 1, wherein the adjustable impedance module comprises an adjustable resistance module, and the adjustable resistance module is configured to receive a plurality of first control signals to adjust a resistance of the adjustable resistance module.

3. The window function processing module of claim 2, wherein the adjustable resistance module comprises a plurality of resistor-selecting units, wherein the resistor-selecting units are controlled by the plurality of first control signals, respectively, and each resistor-selecting unit comprises:
   a resistor; and
   a resistance-controlling switch coupled to the resistor.

4. The window function processing module of claim 3, wherein the plurality of resistor-selecting units are connected to each other in parallel, and the resistor and the resistance-controlling switch of each resistor-selecting unit are connected to each other in series; or the plurality of resistor-selecting units are connected to each other in series, and the resistor and the resistance-controlling switch of each resistor-selecting unit are connected to each other in parallel.

5. The window function processing module of claim 1, wherein the adjustable impedance module comprises a switched-capacitor module coupled between the first input terminal of the operational amplifier and the integrating input terminal of the integrating circuit, and the switched-capacitor module comprises:
   an adjustable capacitance module, configured to receive a plurality of second control signals, to adjust a capacitance value between a first terminal and a second terminal of the adjustable capacitance module;
   a first switch, coupled to the first terminal;
   a second switch, coupled between the first terminal and a ground;
   a third switch, coupled between the second terminal and the first input terminal of the operational amplifier; and
   a fourth switch, coupled between the second terminal and the ground.

6. The window function processing module of claim 5, wherein the adjustable capacitance module comprises a plurality of capacitor-selecting units, and the capacitor-selecting units are controlled by the plurality of second control signals, respectively, and each capacitor-selecting unit comprises:
   a capacitor; and
   a capacitance-controlling switch coupled to the capacitor.

7. The window function processing module of claim 6, wherein the plurality of capacitor-selecting units are connected to each other in parallel, the capacitor and the capacitance-controlling switch of each capacitor-selecting unit are connected to each other in series; or wherein the plurality of capacitor-selecting units are connected to each other in series, the capacitor and the capacitance-controlling switch of each capacitor-selecting unit are connected to each other in parallel.

8. The window function processing module of claim 5, wherein the switched-capacitor module further comprises:

at least a resistor unit, coupled between the first switch and the third switch.

9. The window function processing module of claim 1, further comprising:
a mixing unit, coupled to the integrating circuit, configured to generate the integrating input signal.

10. The window function processing module of claim 1, further comprising:
an analog-to-digital converter, coupled to the integrating circuit, configured to convert the integrating output signal as a digital signal.

11. The window function processing module of claim 1, wherein the window function is a triangular window, a Hann window, a Hamming window, a Blackman window, a cosine window or a Gaussian window.

12. The window function processing module of claim 1, wherein the control unit is configured to output a plurality of control signals corresponding to a plurality of integrating subintervals in the plurality of integrating subintervals, such that at the plurality of integrating subintervals the integrating circuit comprises a plurality of integration gains corresponding to the plurality of integrating subintervals, and the plurality of integration gains corresponding to the plurality of integrating subintervals are related to the window function.

13. The window function processing module of claim 12, wherein the control unit comprises:
a counter, configured to record an integrating time of the integrating circuit; and
a storage unit, configured to store the plurality of control signals corresponding to the plurality of integrating subintervals;
wherein when a counting value of the counter is between an integrating subinterval of the plurality of integrating subintervals, the control unit is configured to read the storage unit to output the control signal corresponding to the integrating subinterval, such that the integrating circuit comprise an integration gain corresponding to the integrating subinterval.

* * * * *